(12) United States Patent
Lenoir et al.

(10) Patent No.: US 11,264,553 B2
(45) Date of Patent: Mar. 1, 2022

(54) OVERHEAT DETECTION SYSTEM AND INSULATION MUFF COMPRISING AN OVERHEAT DETECTION SYSTEM

(71) Applicant: Airbus Operations S.L., Getafe (ES)

(72) Inventors: Brice Lenoir, Getafe (ES); Panagiotis Mourtis Ioannou, Getafe (ES)

(73) Assignee: AIRBUS OPERATIONS S.L., Getafe (ES)

( * ) Notice: Subject to any disclaimer, the term of this patent is extended or adjusted under 35 U.S.C. 154(b) by 26 days.

(21) Appl. No.: 16/421,844

(22) Filed: May 24, 2019

(65) Prior Publication Data

US 2019/0371993 A1    Dec. 5, 2019

(30) Foreign Application Priority Data

May 30, 2018 (EP) ..................................... 18382371

(51) Int. Cl.
*H01L 35/04* (2006.01)
*G01K 1/14* (2021.01)
*G01K 3/00* (2006.01)
*H01L 35/34* (2006.01)

(52) U.S. Cl.
CPC ................ *H01L 35/04* (2013.01); *G01K 1/14* (2013.01); *G01K 3/005* (2013.01); *H01L 35/34* (2013.01)

(58) Field of Classification Search
CPC ........... H01L 35/04; H01L 35/34; G01K 1/14; G01K 3/005; G01K 2215/00; G01K 1/024; G01K 17/06; G01K 7/16; B64D 15/04; B64D 13/08

See application file for complete search history.

(56) References Cited

U.S. PATENT DOCUMENTS

| 8,963,691 B1 * | 2/2015 | Mitchell ................ H04Q 9/00 340/10.42 |
| 10,559,737 B2 * | 2/2020 | Baniecki ................ H01L 35/34 |
| 2002/0145538 A1 * | 10/2002 | Bocko ...................... G01K 7/00 340/870.28 |
| 2009/0184829 A1 | 7/2009 | Rivers, Jr. |
| 2010/0177801 A1 * | 7/2010 | Geren ...................... G01K 5/58 374/117 |

(Continued)

FOREIGN PATENT DOCUMENTS

| DE | 19724769 A1 | 12/1998 |
| DE | 10344553 A1 | 4/2005 |
| EP | 2818783 A1 | 12/2014 |

OTHER PUBLICATIONS

European Search Report; priority document.

*Primary Examiner* — Benjamin Tzu-Hung Liu
(74) *Attorney, Agent, or Firm* — Greer, Burns & Crain, Ltd.

(57) ABSTRACT

An overheat detection system and insulation muff comprising an overheat detection system. The overheat detection system comprises a thermometer, a thermal harvesting module comprising at least one passive radiator, the thermal harvesting module being able to generate electrical energy from the thermal difference between two elements, and a digital module, comprising a power management system, a data treatment system and a wireless transmission system, wherein the electrical energy generated by the thermal harvesting module powers the thermometer and the digital module.

7 Claims, 2 Drawing Sheets

(56) References Cited

U.S. PATENT DOCUMENTS

2012/0018014 A1* 1/2012 Fernandes ............... F16L 23/04
　　　　　　　　　　　　　　　　　　　137/561 A
2016/0332501 A1* 11/2016 Hull ........................ B32B 5/024
2017/0370516 A1* 12/2017 Fouard .................. F16L 59/168

* cited by examiner

OVERHEAT DETECTION SYSTEM AND INSULATION MUFF COMPRISING AN OVERHEAT DETECTION SYSTEM

CROSS-REFERENCES TO RELATED APPLICATIONS

This application claims the benefit of the European patent application No. 18382371.5 filed on May 30, 2018, the entire disclosures of which are incorporated herein by way of reference.

FIELD OF THE INVENTION

This invention refers to an overheat detection system, which is mainly used for detecting hot air leaks in systems with hot air ducts, especially applicable to aircraft. The invention also refers to an insulation muff comprising an overheat detection system.

BACKGROUND OF THE INVENTION

Pneumatic ducting in aircraft runs along the pylon, wing and fuselage to drive hot air from the engines and the APU to the wing anti-ice and air conditioning packs. This routing is made of insulated titanium ducts clamped to each other.

Each duct junction is insulated with a flexible insulation, fixed with Velcro or cord, wrapped around it (also called "muff" or "insulation muff").

Typically, an insulation muff comprises an inner covering film, an outer covering film, an insulation material in between and a venting hole to allow hot air flow leakage from the duct to be directed towards overheat sensors and, in that way, to detect the leak. They may also comprise a flow guidance device (such as a venting grid) able to provide a homogeneous flow towards the overheat sensors.

As the bleed ducting contains pressurized air up to 260° C. (and approximately 700° C. in the pylon), the Overheat Detection System (OHDS) ensures fast leak and burst detection, in order to isolate the system and protect the surrounding structure and systems. The early detection of hot air leakages in aircraft systems is very important to prevent any damage to the structure and components, and fire and/or explosions in the fuel tanks of the aircraft, which could result from duct leak or rupture.

The current OHDS is composed of linear sensors, mainly "eutectic salt" sensors, running along the pipe, and wired to an interrogator. These "eutectic salt" sensors are basically constituted by a rigid coaxial cable (typically made of nickel) with a salt that changes electrical resistance when heated. As a leak of hot air happens, it is directed onto the sensor by the venting holes in the outer cover of the duct insulation muff. Accordingly, the local electrical resistance of the salt changes, which is detected by the interrogator.

This OHDS with eutectic salt sensors does not allow an accurate localization of the defect, and is also very subject to false alarms and open circuits, which heavily affect the reliability. Additionally, the sensors are fairly difficult and sensitive to install, due to the rigidity of the cables.

Other OHDS are based on optical-fiber elements. The fiber contains FBG (Fiber Bragg Grating) elements which reflect a specific wavelength. That wavelength changes with temperature. By setting the FBGs to different wavelengths and reading the change in reflected light, the interrogator can measure the temperature of each point of the fiber. Those sensing elements must be wired to the interrogator by optical fiber.

However, also some issues have to be worked in order to fit enough FBG on one fiber, and this technology based on optical fiber elements is also very sensitive to unclean connections.

SUMMARY OF THE INVENTION

An object of the present invention is to provide an OHDS that overcomes the drawbacks existing in the prior art systems.

The invention provides an overheat detection system comprising:
a thermometer,
a thermal harvesting module comprising at least one passive radiator, the thermal harvesting module being able to generate electrical energy from the thermal difference between two elements, and
a digital module, comprising means for power management, means for data treatment and means for wireless transmission,
wherein the electrical energy generated by the thermal harvesting module powers the thermometer and the digital module.

The OHDS of the invention allows the removal of all or most of the cables, the accurate localization of the defect, and improves reliability with respect to the current eutectic salt.

Another advantage of the invention is that it requires low maintenance, as no battery is needed.

The invention also provides an insulation muff comprising an inner cover, an outer cover, an insulation material in between and a venting hole to guide hot air flow leakages from the duct on which the insulation muff is intended to be installed, that additionally comprises an overheat detection system integrated in the insulation muff at the location of the venting hole, wherein the thermal harvesting module, the thermometer and the digital module are integrated into a housing.

Another embodiment of the invention provides an insulation muff comprising an inner cover, an outer cover, an insulation material in between and a venting hole to guide hot air flow leakages from the duct on which the insulation muff is intended to be installed, that additionally comprises an overheat detection system, wherein the part of the overheat detection system comprising the thermometer and the digital module is integrated in the insulation muff at the location of the venting hole.

Other characteristics and advantages of the present invention will be clear from the following detailed description of several embodiments illustrative of its object in relation to the attached figures.

DETAILED DESCRIPTION OF THE PREFERRED EMBODIMENTS

Figure 1:
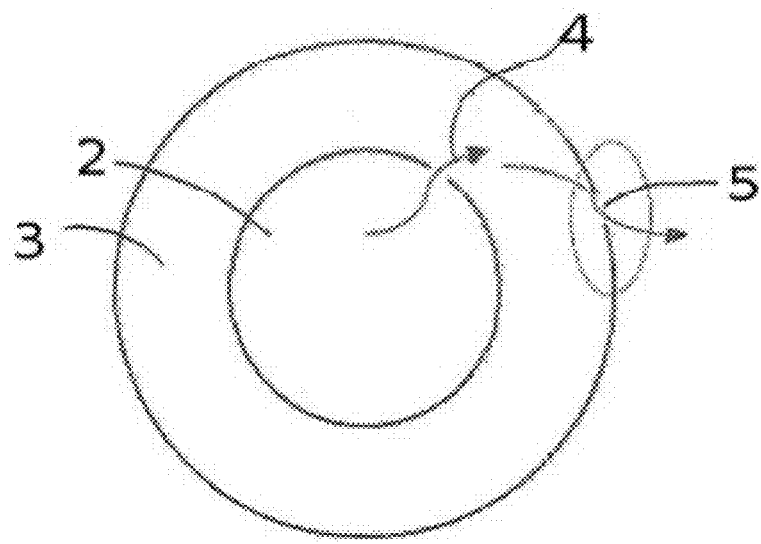
FIG. 1 shows a schematic view of a leak in a hot air duct with an insulation muff.

FIG. 1 shows a typical view of a leak 4 in a hot air duct 2 with an insulation muff 3. The venting hole 5 of the insulation muff 3 allows that the leak 4 of hot air flow is directed outwards, specifically towards sensing elements (not shown in this figure).

The insulation of each duct 2 can be made to direct any leak 4 towards the nearest duct junction, where the hot leaked air will pass through the venting hole 5 of the insulation muff 3.

Figure 2:
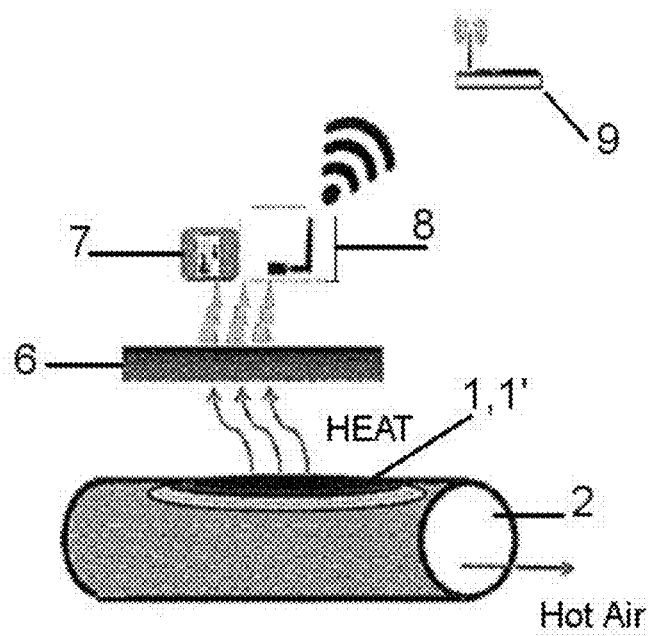
FIG. 2 shows a schematic view of the operation of an OHDS of the invention on a hot air duct.

FIG. 2 shows a general view of the elements and the operation of an OHDS 1, 1' of the invention on a hot air duct 2. The OHDS 1, 1' comprises a thermal harvesting module 6 that generates low power from the thermal difference between the hot air duct 2 and the surrounding air. It powers a thermometer 7 as well as a digital module 8 with means for wireless transmission, which can perform wireless data transmission to a receiver 9 (wired to the avionics).

Accordingly, the general configuration of the OHDS 1, 1' of the invention comprises:
a thermometer 7,
a thermal harvesting module 6 comprising at least one passive radiator 12, the thermal harvesting module 6 being able to generate electrical energy from the thermal difference between two elements, and
a digital module 8, comprising means for power management, means for data treatment and means for wireless transmission,
wherein the electrical energy generated by the thermal harvesting module 6 powers the thermometer 7 and the digital module 8.

Figure 3:
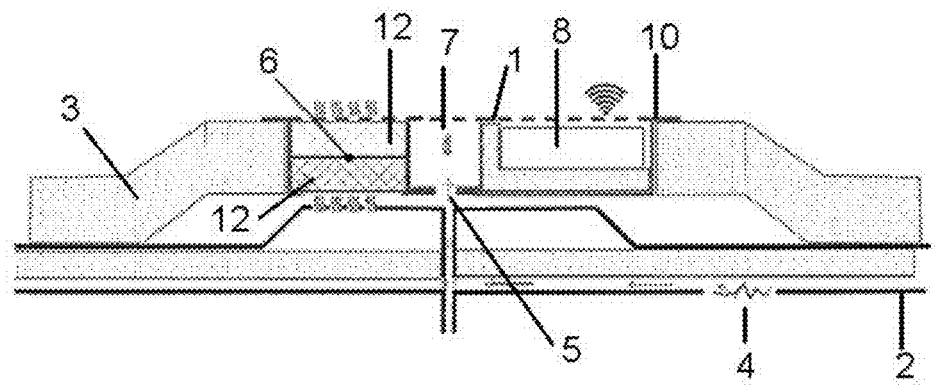
FIG. 3 shows a cross section of an OHDS of the invention, an insulation muff of the invention and the hot air duct on which they are installed.

FIG. 3 shows a cross section of an OHDS 1 of the invention, an insulation muff 3 of the invention and the hot air duct 2 on which they are installed (only the upper part of the cross section is shown). The OHDS 1 of FIG. 3 is installed as part of the cover of the insulation muff 3, at the location of the venting hole 5. As it is integrated into the cover, it is installed at the same time, without any additional operation, so its installation is easy and quick.

The thermal harvesting module 6 is equipped with at least one passive radiator 12 (for instance, two passive radiators 12, one on each side) to ensure thermal exchange from the hot air below the insulation muff 3 to the ambient air. If the difference of temperatures is high enough, it may be possible to have only one passive radiator 12 in the thermal harvesting module 6.

The thermometer 7 is installed at the venting hole 5 location, away enough from the duct 2 to ensure measurement of the eventual leakage hot air flow, and not of normal heating from the duct 2.

The digital module 8 comprises the means for power management (including means for voltage transformation, and means for storing of the energy for some limited time, for instance using a condenser), means for data treatment (eventually with a low-energy microcontroller if necessary), and means for wireless transmission.

The wireless transmission can be using an available network (such as WAIC: Wireless Avionics Intra-Communication), or communicating with a specific receiver 9 that is wired to the avionics.

In the embodiment shown in FIG. 3 all the components of the OHDS 1 can be integrated in a housing 10 (for instance, a small rigid case), sewed on the insulation muff 3.

The insulation muff 3 of FIG. 3 can comprise an inner cover, an outer cover, an insulation material in between and a venting hole 5 to guide hot air flow leakages from the duct 2 on which the insulation muff 3 is intended to be installed, and additionally comprises an overheat detection system 1 as described integrated in the insulation muff 3 at the location of the venting hole 5.

Figure 4:
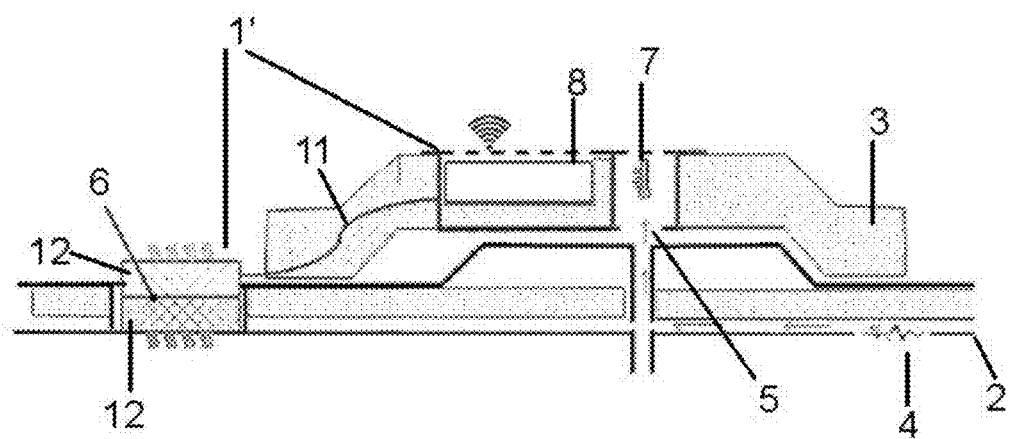
FIG. 4 shows a cross section of another embodiment of an OHDS of the invention, another embodiment of an insulation muff of the invention and the hot air duct on which they are installed.

FIG. 4 shows a cross section of another embodiment of an OHDS 1' of the invention, another embodiment of an insulation muff 3 of the invention and the hot air duct 2 on which they are installed. In this alternative embodiment, the hot side of the thermal harvesting module 6 can be in contact with the duct 2 metal directly, if the thermal generation cannot produce sufficient power using two passive radiators 12.

In this embodiment the thermal harvesting module 6 is separated from the rest of the system that comprises the thermometer 7 and the digital module 8.

The thermal harvesting module 6 is put in contact with the duct 2 metal, and a radiator 12 is used on the cold side. It is connected to the rest of the system by a cable 11.

This configuration needs a special shape on the duct 2, with a flat surface accessible through a space in the duct insulation.

It allows generating more energy, but makes the duct manufacturing and the installation of the OHDS 1' more complicated and costly with respect to the embodiment of FIG. 3.

The insulation muff 3 of FIG. 4 can comprise an inner cover, an outer cover, an insulation material in between and a venting hole 5 to guide hot air flow leakages from the duct 2 on which the insulation muff 3 is intended to be installed, and additionally comprises an overheat detection system 1' wherein the part of the overheat detection system 1' comprising the thermometer 7 and the digital module 8 is integrated in the insulation muff 3 at the location of the venting hole 5.

Although the present invention has been fully described in connection with preferred embodiments, it is evident that modifications may be introduced within the scope thereof, not considering this as limited by these embodiments, but by the contents of the following claims.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:
1. An insulation muff comprising:
an inner cover,
an outer cover,
an insulation material in between the inner and outer covers,
a venting hole to guide hot air flow leakages from a duct on which the insulation muff is intended to be installed, and an overheat detection system integrated in the insulation muff at a location of the venting hole, the overheat detection system comprising:
- a thermometer,
- a thermal harvesting module comprising at least one passive radiator, the thermal harvesting module being able to generate electrical energy from a thermal difference between two elements, and
- a digital module, comprising a power management circuit, a data controller, and a wireless transmitter, wherein the electrical energy generated by the thermal harvesting module powers the thermometer and the digital module, wherein at least the digital module is integrated in the insulation muff.

2. The insulation muff according to claim 1, wherein the thermal harvesting module comprises two passive radiators.

3. The insulation muff according to claim 1, wherein the thermal harvesting module, the thermometer and the digital module are integrated into a housing.

4. The insulation muff according to claim 1, wherein thermal harvesting module is integrated in the insulation muff.

5. The insulation muff according to claim 4, wherein thermometer is located within the venting hole.

6. The insulation muff according to claim 1, wherein thermometer is located within the venting hole.

7. An insulation muff comprising:
- an inner cover,
- an outer cover,
- an insulation material in between the inner and outer covers,
- a venting hole to guide hot air flow leakages from a duct on which the insulation muff is intended to be installed, and
- an overheat detection system integrated in the insulation muff at a location of the venting hole, the overheat detection system comprising:
  - a thermometer,
  - a thermal harvesting module comprising at least one passive radiator, the thermal harvesting module being able to generate electrical energy from a thermal difference between two elements, and
  - a digital module, comprising a power management circuit, a data controller, and a wireless transmitter,
- wherein the electrical energy generated by the thermal harvesting module powers the thermometer and the digital module, wherein thermometer is located within the venting hole.

* * * * *